US010216659B2

(12) United States Patent
Brainard et al.

(10) Patent No.: US 10,216,659 B2
(45) Date of Patent: Feb. 26, 2019

(54) MEMORY ACCESS SIGNAL DETECTION UTILIZING A TRACER DIMM

(71) Applicant: Hewlett Packard Enterprise Development LP, Houston, TX (US)

(72) Inventors: Jim W Brainard, Houston, TX (US); Hubert E Brinkmann, Jr., Houston, TX (US); Kevin T Lim, Palo Alto, CA (US); Mitchel E Wright, Houston, TX (US); Raghavan V Venugopal, Houston, TX (US); Reza M Bacchus, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 109 days.

(21) Appl. No.: 15/314,605

(22) PCT Filed: May 30, 2014

(86) PCT No.: PCT/US2014/040201
§ 371 (c)(1),
(2) Date: Nov. 29, 2016

(87) PCT Pub. No.: WO2015/183303
PCT Pub. Date: Dec. 3, 2015

(65) Prior Publication Data
US 2017/0199831 A1 Jul. 13, 2017

(51) Int. Cl.
*G06F 13/00* (2006.01)
*G06F 13/16* (2006.01)
(Continued)

(52) U.S. Cl.
CPC ...... *G06F 13/1689* (2013.01); *G06F 13/4068* (2013.01); *G11C 5/04* (2013.01);
(Continued)

(58) Field of Classification Search
CPC ............ G06F 13/1689; G06F 13/4068; G06F 13/4063; G06F 13/1668; G06F 13/16
See application file for complete search history.

(56) References Cited

U.S. PATENT DOCUMENTS 6,049,476 A  4/2000 Laudon et al.
9,280,497 B2 * 3/2016 Berke .................... G06F 13/16
(Continued)

OTHER PUBLICATIONS

Huang, Y. et al., "HMTT: A Hybrid Hardware/Software Tracing System for Bridging the DRAM Access Trace's Semantic Gap", (Research Paper), Oct. 19, 2013, 25 pages.
(Continued)

*Primary Examiner* — Jing-Yih Shyu
(74) *Attorney, Agent, or Firm* — Hewlett Packard Enterprise Patent Department

(57) ABSTRACT

An example system includes a memory controller; a memory bus coupled to the memory controller; and a dual inline memory module (DIMM) coupled to the memory controller through the memory bus. The DIMM includes a dynamic random access memory (DRAM) portion; a storage portion; and a gate array portion coupled to the memory bus to detect memory access signals and to store information related to the memory access signals on the storage portion.

12 Claims, 5 Drawing Sheets

(51) Int. Cl.
  *G11C 5/04* (2006.01)
  *G06F 13/40* (2006.01)
  *G11C 29/04* (2006.01)
  *G06F 17/50* (2006.01)

(52) U.S. Cl.
  CPC ...... *G06F 13/1694* (2013.01); *G06F 17/5054* (2013.01); *G06F 2217/14* (2013.01); *G11C 2029/0409* (2013.01)

(56) References Cited

U.S. PATENT DOCUMENTS

| | | |
|---|---|---|
| 2002/0108015 A1 | 8/2002 | Lai et al. |
| 2005/0289399 A1 | 12/2005 | Kimura |
| 2006/0044860 A1 | 3/2006 | Kinsley et al. |
| 2008/0126690 A1* | 5/2008 | Rajan ............... G06F 12/06 711/105 |
| 2008/0294951 A1 | 11/2008 | Ahmad et al. |
| 2010/0325383 A1 | 12/2010 | Karamcheti et al. |
| 2011/0246712 A1 | 10/2011 | Vergis et al. |
| 2012/0072666 A1* | 3/2012 | Deleris ............... G06F 11/364 711/118 |
| 2014/0075250 A1* | 3/2014 | Katayama ............ G06F 11/073 714/704 |

OTHER PUBLICATIONS

PCT Search Report/Written Opinion, Application No. PCT/US2014/040201 dated Feb. 4, 2015, 10 pages.

\* cited by examiner

MEMORY ACCESS SIGNAL DETECTION UTILIZING A TRACER DIMM

BACKGROUND

Memory usage and access information may be useful in analyzing and improving designs for memory operations and architecture. Such information may be collected through memory traces (e.g., memory address accesses) from a memory controller.

BRIEF DESCRIPTION OF THE DRAWINGS

For a more complete understanding of various examples, reference is now made to the following descriptions taken in connection with the accompanying drawings in which.

DETAILED DESCRIPTION

Various examples described below provide for monitoring of a memory controller and associated memory accesses. As described below, a dual inline memory module (DIMM) may be provided with a field programmable gate array (FPGA) and a storage device, such as one or more flash memory chips. The FPGA can monitor the memory address bus from the memory controller and detect all memory accesses to that DIMM. The FPGA can obtain certain information from the access signals, including the chip select signal for multi-rank DIMMs. The information can be stored on the flash chips on the DIMM. The DIMM may be provided with enough storage capacity (e.g., multiple flash memory chips) to store memory access information for a desired length of traces. Further, in various examples, the DIMM including the FPGA and the flash memory chips has a form factor which allows housing in a standard server environment.

Figure 1:
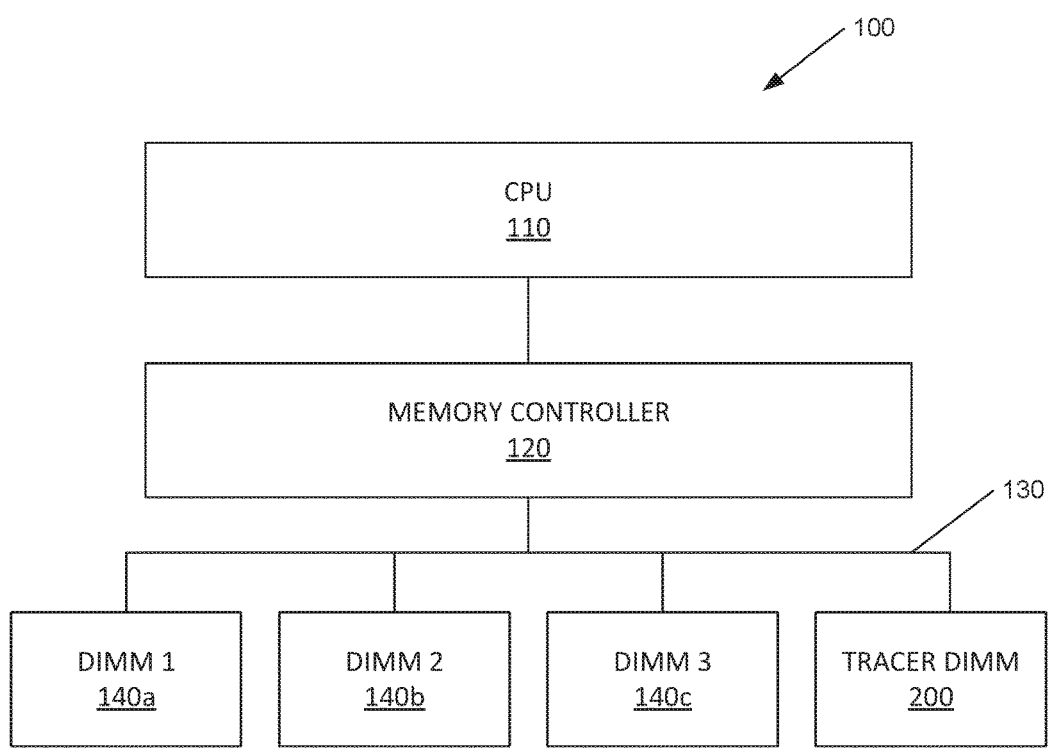
FIG. 1 illustrates an example system for monitoring a memory controller.

Referring first to FIG. 1, an example system for monitoring a memory controller is illustrated. The example system 100 of FIG. 1 may be implemented in a variety of computer systems. In one example, the system 100 is implemented in a standard server system. The example system 100 includes a central processing unit (CPU) 110 coupled to a memory controller 120. The CPU 110 may execute a variety of commands as may be indicated by firmware or software, for example.

Various commands executed by the CPU 110 may require access to data or other information stored in the memory of the example system 100. In this regard, the example system 100 is provided with various memory systems. The example system 100 of FIG. 1 includes multiple slots for dual inline memory modules (DIMMs) 140a-c that are coupled to the memory controller 120 through a memory bus 130 (e.g., an address bus). Based on the commands executed by the CPU 110, the memory controller 120 may send a signal on the address bus 130 to access a particular memory component (e.g., dynamic random access memory (DRAM)) or groups of components on a DIMM 140a-c installed on various DIMM slots coupled to the memory controller 120.

As noted above, memory usage and access information may be useful in analyzing and improving designs for memory operations and architecture. Examples of the present disclosure provide a DIMM device that may be installed in a DIMM slot to facilitate collection of such data in an efficient manner. In various examples, collection of the data may be achieved with little or no overhead added to the system 100. In this regard, FIG. 1 illustrates a tracer DIMM 200 installed in a DIMM slot that is coupled to the memory controller 120 through the address bus 130. Various examples of tracer DIMMs are described below with reference to FIGS. 2 and 3.

Figure 2:
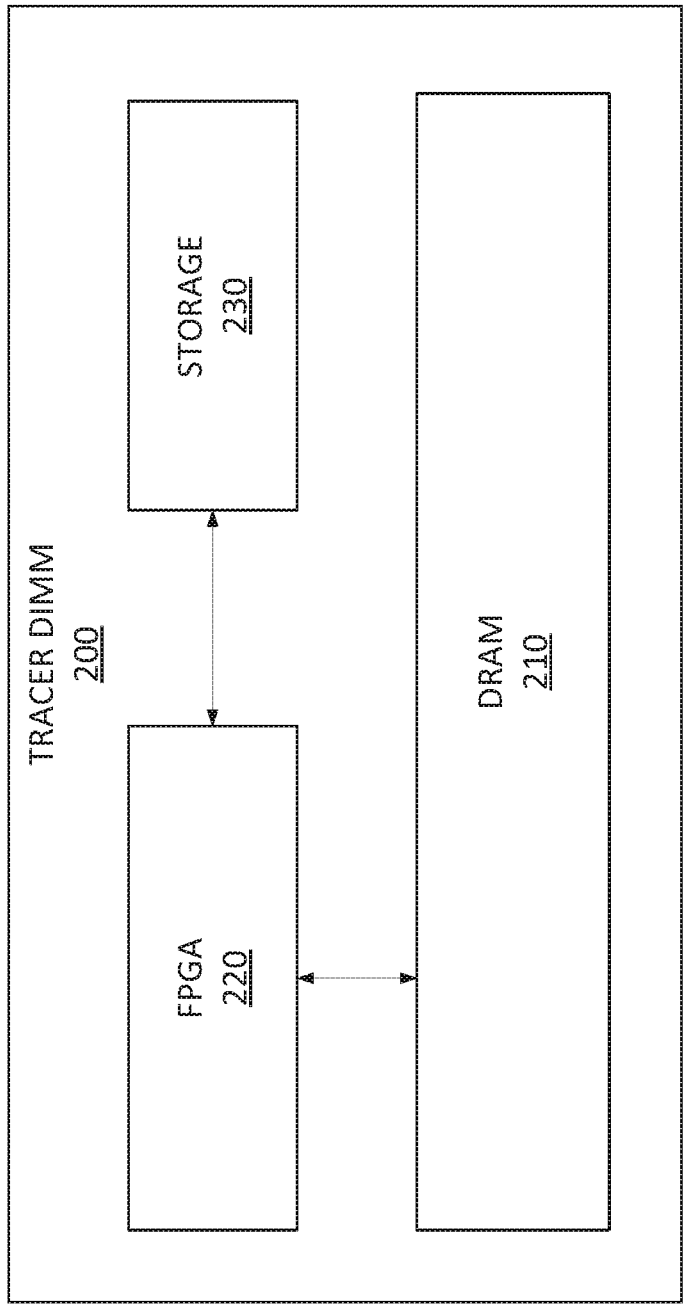
FIG. 2 schematically illustrates an example dual in-line memory module (DIMM) for tracing memory accesses.

Referring now to FIG. 2, an example tracer DIMM 200 for tracing memory accesses is schematically illustrated. The tracer DIMM 200 of FIG. 2 includes a DRAM section 210, a field programmable gate array (FPGA) 220 and a storage section 230. The DRAM section 210 may be identical to a DRAM section in the other DIMMs 140a-c coupled to the memory controller 120. Thus, the tracer DIMM 200 appears to the memory controller 120 and the address bus 130 as any other DIMM. In various examples, the FPGA 220 may be connected, directly or indirectly, to the address bus 130 to facilitate capture of memory access signals from the address bus 130. Upon capture of the signals by the FPGA 220, relevant or desired information from the signals may be stored in the storage section 230. Thus, the tracer DIMM 200 provides a self-contained device which can capture memory access signals and store the trace information. The tracer DIMM. 200 may be removed from the system 100 for off-line analysis of the stored tracer information, for example.

Further, since the FPGA 220 can capture signals from the memory bus 130, there is no need to interfere with normal operation of the memory controller 120 or the system 100. For example, the tracer DIMM 200 does not require any separate signals to be sent to the memory controller 120 or additional processes to be added, resulting in no additional overhead as a result of the capture of the memory traces.

Additionally, in various examples, the tracer DIMM 200 is able to capture information which specifically identifies each memory address requested by the memory controller 120 regardless of to which DIMM the memory address corresponds. Since the tracer DIMM 200 is connected to the memory bus 130, the tracer DIMM 200 is able to see all of the commands and addresses transmitted on the memory bus 130. Thus, the tracer DIMM 200 sees commands and addresses related to not only the tracer DIMM 200, but also other DIMM's on the memory bus 130 such as DIMMs 140a-c.

Further, with the FPGA 220 connected to the memory bus 130, the tracer DIMM 200 can capture the chip select signal from the memory controller 120 for memory access request signals associated with the tracer DIMM 200. For multi-rank tracer DIMMs, each memory access request signal may correspond to an address on one of the multiple ranks. In various examples, the tracer DIMM 200 can identify which rank of the tracer DIMM 200 the memory access request corresponds to.

The captured information is stored in the storage section 230. The storage section 230 may include one or more types of memory devices which may be sized to store a sufficient amount of trace information. For example, as described below with reference to FIG. 3, the storage section 230 may include one or more flash memory chips for storing 10, 20, 30 or more minutes of trace data.

Figure 3:
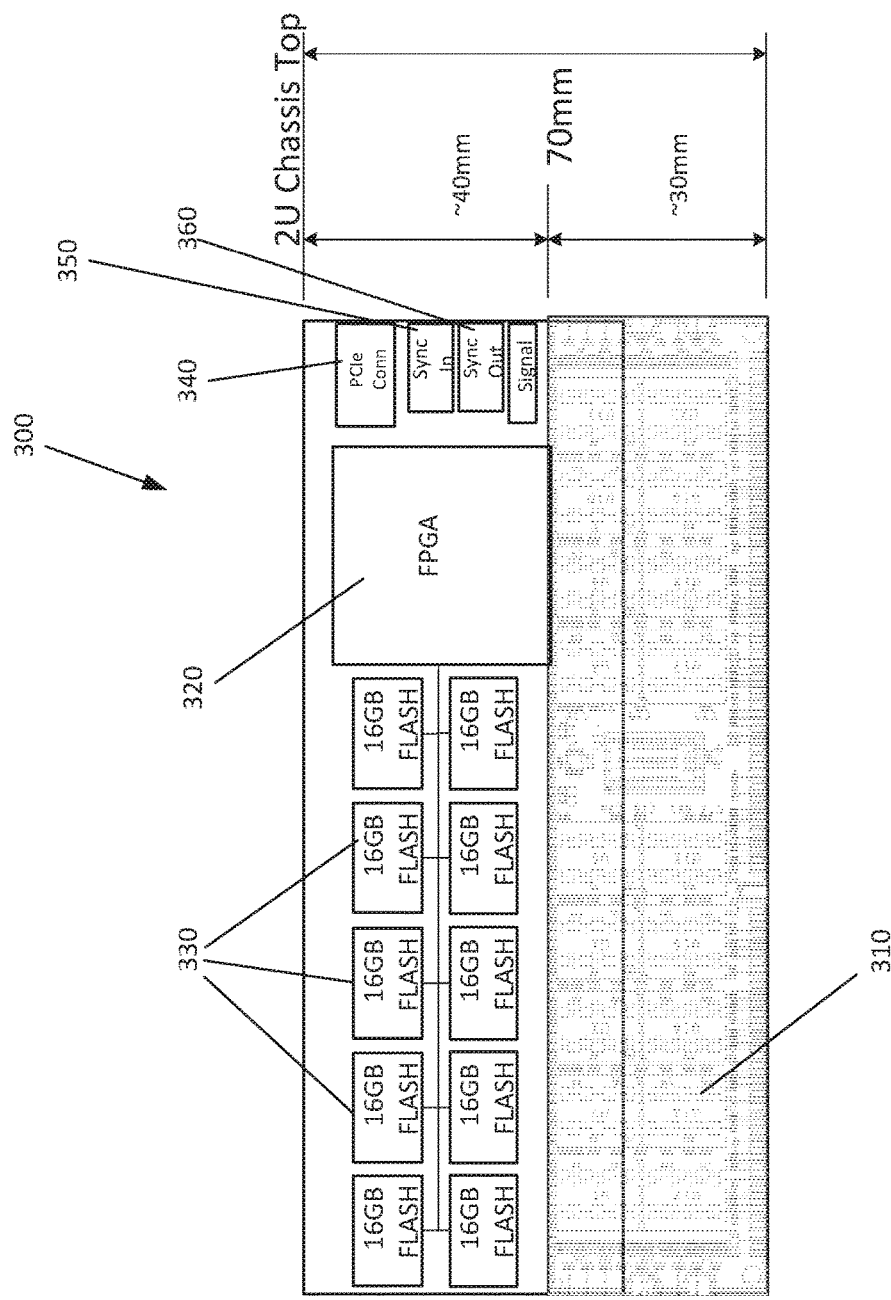
FIG. 3 illustrates an example dual inline memory module (DIMM) for tracing memory accesses.

Referring now to FIG. 3, an example tracer DIMM for tracing memory accesses is illustrated. The illustrated example tracer DIMM 300 is provided with a DRAM section 310, an FPGA 320 and a storage section including storage devices 330, similar to the example described above with reference to FIG. 2. The DRAM section 310 of the illustrated example includes 36×4 double data rate (DDR3) DRAMs. In various examples, the DDR3 memory operates in a similar or identical manner to the DRAM section of the other DIMMs connected to the memory bus. Thus, to the memory controller and the remainder of the system 100, the tracer DIMM 300 appears as a standard DIMM in terms of signal integrity and functionality. Further, the tracer DIMM 300 does not require any custom operating system features (e.g., basis input/output system (BIOS)). In one example, the DRAM provides 16 gigabytes of capacity with two ranks.

The FPGA 320 of the example tracer DIMM 300 is connected to the command and address bus that is broadcast from the DIMM's register chip. Thus, the tracer DIMM 300 does not increase any loading on the memory bus and adds no overhead. Certain ports of the FPGA snoop the command and address bus for the memory access signals. In various examples, these ports are double clocked, enabling the FPGA 320 to trace the high-speed DDR3 protocol.

In the example of FIG. 3, the storage devices 330 include ten flash memory chips, each having a 16 gigabyte capacity. Various other examples may be provided with other types of storage devices and a different storage capacity.

As illustrated in FIG. 3, the tracer DIMM 300 of FIG. 3 has a form factor which allows it to be installed in a standard 2U server. In this regard, the tracer DIMM 300 has a height of approximately 70 mm. In one example, this form factor is achieved by using a standard 36 DRAM memory module have a height of 30 mm. The FPGA 320 and the storage devices 330 are provided on the upper part of the tracer DIMM 300. Desired signals may be routed from the memory bus through the bottom part of the tracer DIMM 300 to the FPGA 320.

Various examples of tracer DIMMs may include additional components. For example, the example tracer DIMM 300 of FIG. 3 is provided with a connector 340 to allow connection of the tracer DIMM 300 to external input/output devices. For example, the connector 340 may be used to connect an external device for analysis of the memory trace information stored on the storage devices 330. In other examples, as described below with reference to FIG. 6, the connector 340 may be used to connect the tracer DIMM 300 to other tracer DIMMs. In other examples, a separate connector may be provided for connecting the tracer DIMM 300 to other tracer DIMMs, while the connector 340 is reserved for connecting to an external device.

Figure 4:
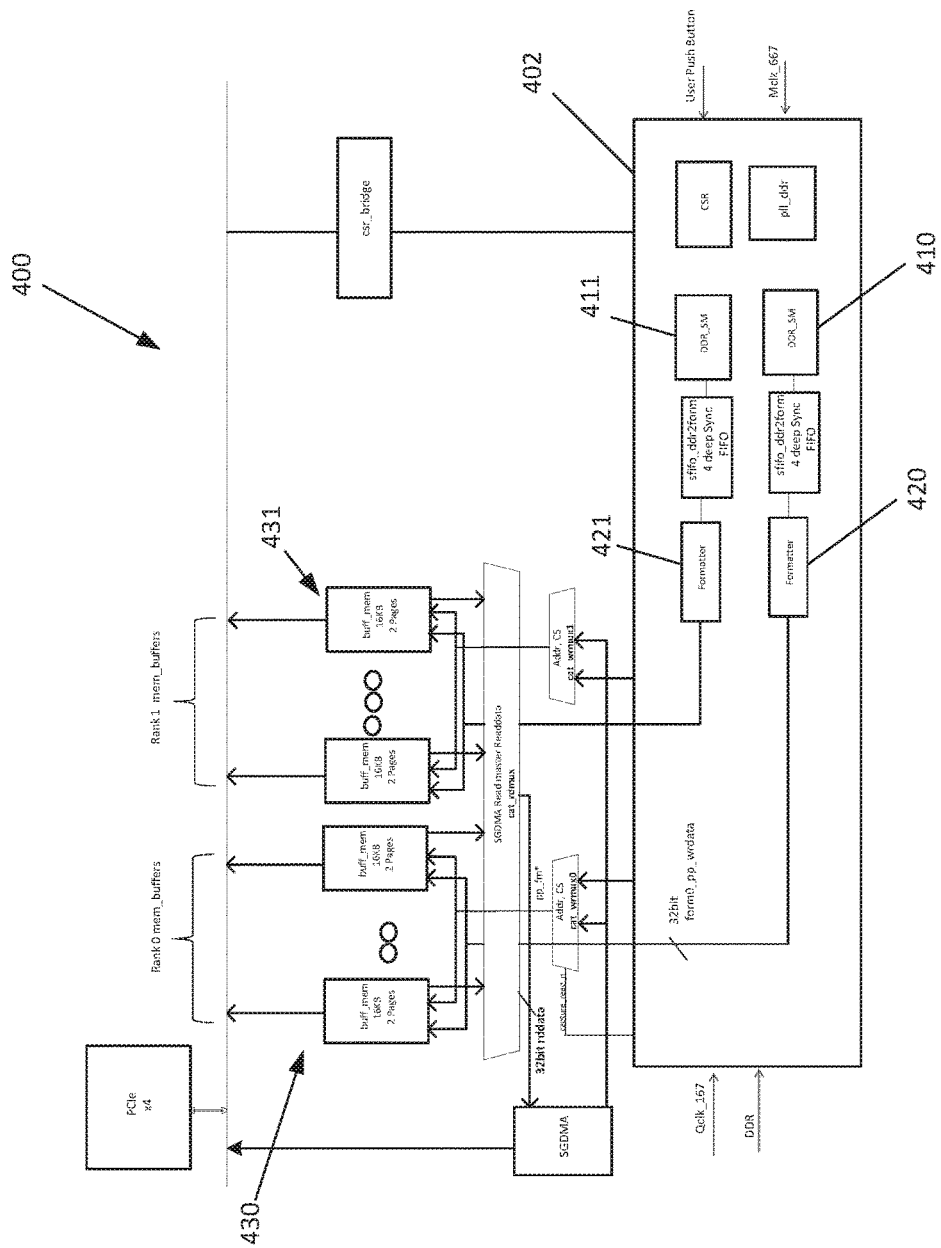
FIG. 4 illustrates a block diagram of an example memory tracer.

Referring now to FIG. 4, a block diagram provides a schematic illustration of an example memory tracer. In the example of FIG. 4, the tracer DIMM 400 includes a tracer portion 402 which can accommodate a DRAM section divided into two ranks. In various examples, as described above with reference to FIGS. 1-3, the tracer portion 402 may be implemented in the FPGA of the tracer DIMM 400.

In the example of FIG. 4, a separate state machine 410, 411 is provided for each rank of the DIMM. Each state machine 410, 411 may track the current state of the associated rank based on commands detected from the memory controller on the memory bus. Thus, the state machine 410 may track the current state for rank 0, and the state machine 411 may track the current state for rank 1.

Each state machine 410, 411 is coupled to a formatter 420, 421 for the associated rank. The formatters 420, 421 use the current state for each rank and the memory address in requested by the memory controller to create traces of memory addresses for each rank. In one example, the formatters 420, 421 create 32-bit traces of the memory addresses for storage in the flash memory chips described above with reference to FIG. 3. In various examples, the 32-bit traces may include information such as the command from the memory controller (e.g., activate (ACT), read (RD), write (WR), etc.), the status of the memory trace itself and the number of cycles since the previous trace entry.

In the example illustrated in FIG. 4, the formatters 420, 421 write the traces to buffers 430, 431. When the buffers 430, 431 are full, the information is written to the flash chips, and the buffers are emptied. The use of the buffers 430, 431 allow the tracer 402 to keep up with the speed of the DDR3 DRAM.

Figure 5:
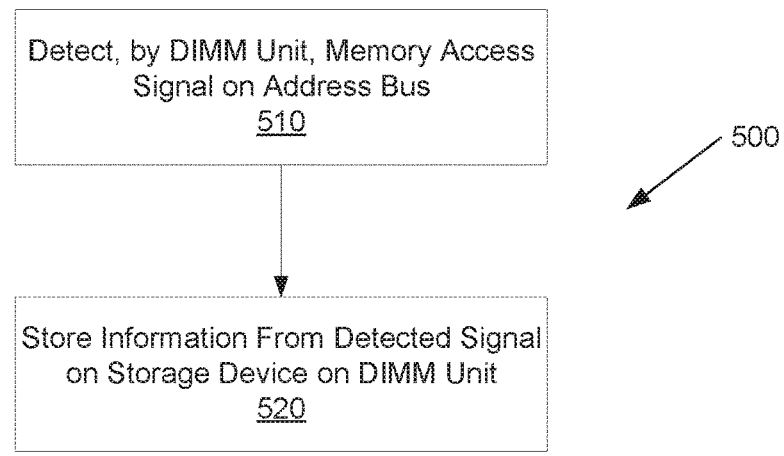
FIG. 5 illustrates an example process for tracing memory accesses.

Referring now to FIG. 5, an example process for tracing memory accesses is illustrated. The process 500 may be implemented on or using the example tracer DIMMs described above with reference to FIGS. 1-4. In accordance with the example process 500, at block 510, the DIMM unit (e.g., tracer DIMM 300 of FIG. 3) is used to detect a memory access signal on a memory address bus (e.g., the memory bus 130 of FIG. 1). As noted above, the memory access signal may be detected by an FPGA of the DIMM unit and may include the chip select signal to identify the DIMM and/or the rank within the DIMM corresponding to the memory access signal. In the example process 500 of FIG. 5, certain information from the detected memory access signal may be stored on a storage device on the DIMM unit (block 520). For example, as described above with reference to FIG. 3, information from the memory access signal may be stored on one or more storage devices 330 of the tracer DIMM 300.

Thus, various examples described above provide tracing of memory accesses with minimal or no overhead since the memory system and the operating system are not disturbed. Further, the tracing is achieved using a self-contained unit which can store the trace information without the need to transfer or transmit that information to an external unit. Additionally, various examples of tracer DIMMs have a form factor which allows them to be mounted in standard server units. For example, the tracer DLMM 300 of FIG. 3 may fit into a standard 2U server.

In some examples, two or more DIMM slots of a memory system may be provided with tracer DIMMs. In one example, all DIMM slots are provided with tracer DIMMs. In this regard, the DRAM portion of each of the tracer DIMMs operates as a normal DRAM, thus resulting in the tracer DLMMs as appearing to the memory controller as normal DIMMs. An example of such an arrangement is illustrated in FIG. 6.

Figure 6:
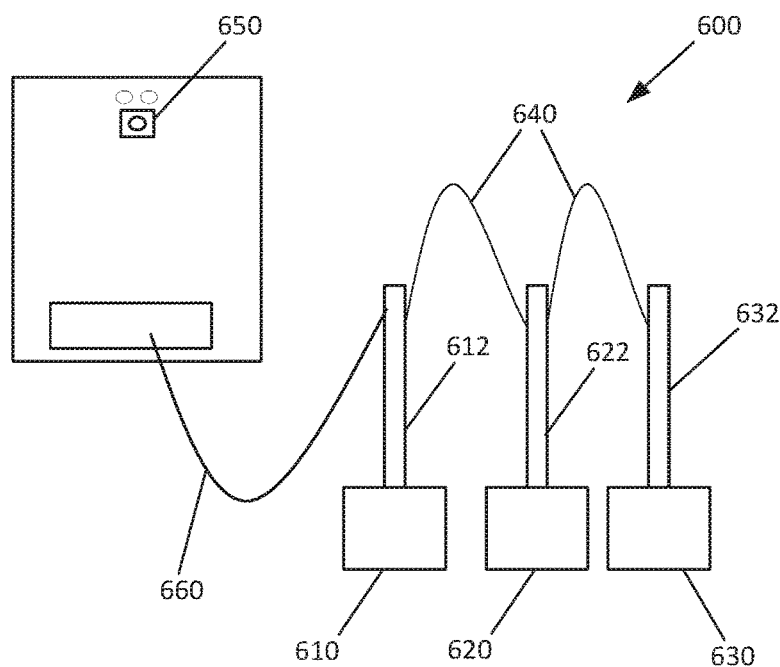
FIG. 6 is an example system for monitoring a memory controller.

FIG. 6 schematically illustrates an example system 600 in which multiple DIMM slots 610, 620, 630 are provided with tracer DIMMs 612, 622, 632, respectively. In various examples, each tracer DIMM may operate independently to trace and store memory access information directed to that particular tracer DIMM. In some examples, it may be desirable to synchronize the tracer DIMMs 612, 622, 632 so that the memory tracing for each tracer DIMM 612, 622, 632 is performed simultaneously. In order to avoid adding overhead to the memory system, the synchronization of the tracer DIMMs may be performed independently of the memory bus. In this regard, as illustrated in FIG. 6, the tracer DIMMs 612, 622, 632 may be daisy chained to one another using cables 640. In other examples, each tracer DIMM 612, 622, 632 may be connected to a common synchronization cable (not shown).

In various examples, each tracer DIMM 612, 622, 632 may be provided with synchronization ports. Referring again to FIG. 3, the example tracer DIMM 300 is provided with a SYNC IN port 350 and a SYNC OUT port 360. The tracer DIMMs 612, 622, 632 of FIG. 6 may be provided with similar ports. Thus, tracer DIMMs 612, 622, 632 are connected and capable of receiving a synchronization signal.

The synchronization signal may be used to indicate starting and/or stopping of the tracing. In one example, the synchronization signal indicates the start of the tracing, and the stopping of the tracing may be performed at a particular time period after the start.

In various examples, synchronization signals may be indicated to each tracer DIMM 612, 622, 632 in a variety of manners. In one example, the synchronization signal is transmitted through a manual command by a user. For example, as illustrated in FIG. 6, the daisy-chained tracer DIMMs 612, 622, 632 may be connected to a server interface 650 (e.g., at the server housing) through another cable 660. The server interface 650 may be a simple push button. The pressing of the button may send a synchronization signal to each tracer DIMM 612, 622, 632 to start or stop the tracing.

In other examples, the server may be connected to the tracer DIMMs 612, 622, 632 are connected to the server processor (e.g., CPU 110 of FIG. 1) via a cable, such as a peripheral component interconnect (PCI) express (PCIe) cable. The server may operate to synchronize the starting and stopping of the trace. For examples, the server may write to a register on the FPGA via the PCIe interface to trigger a start of the trace.

In another example, a specific memory address may be reserved on the first tracer DIMM 612. A command associated with the reserved memory address may indicate a start trace or a stop trace signal to the first tracer DIMM 612. Thus, upon receiving a write access to the reserved address, the first tracer DIMM 612 may issue a synchronization signal to each of the other daisy-chained tracer DIMMs 622, 632, and each tracer DIMM 612, 622, 632 may begin the memory trace.

Thus, in various example, one or more (including all) DIMMs of a memory system may be tracer DIMMs capable of storing a memory trace. In this regard, a complete memory trace for the entire memory system may be obtained with no additional overhead for the memory system.

The various examples set forth herein are described in terms of example block diagrams, flow charts and other illustrations. Those skilled in the art will appreciate that the illustrated examples and their various alternatives can be implemented without confinement to the illustrated examples. For example, block diagrams and their accompanying description should not be construed as mandating a particular architecture or configuration.

What is claimed is:

1. A system, comprising;
a memory controller;
a memory bus coupled to the memory controller; and
a dual inline memory module (DIMM) coupled to the memory controller through the memory bus, the DIMM comprising:
a dynamic random access memory (DRAM) portion;
a storage portion comprising one or more storage devices; and
a gate array portion coupled to the memory bus to detect memory access signals and to store information related to the memory access signals on the storage portion,
wherein the gate array portion is configured to detect memory access signals to any of one or more DIMMs coupled to the memory bus and store information related to the memory access signals directed to any of the one or more DIMMs on the storage portion;
a second DIMM coupled to the memory controller through the memory bus, the second DIMM comprising:
a second DRAM portion;
a second storage portion; and
a second gate array portion coupled to the memory bus to detect memory access signals and to store information related to the memory access signals on the second storage portion,
wherein detection of memory access signals by the gate array portion and detection of memory access signals by the second gate array portion are synchronized;
wherein at least one of the DRAM portion or the second DRAM portion includes a selected memory address, wherein an access command to the selected memory address is used to synchronize detection of memory access signals by the gate array portion and detection of memory access signals by the second gate array portion.

2. The system of claim 1, wherein the one or more storage devices comprises one or more flash memory chips.

3. The system of claim 1, wherein the DRAM portion has two or more ranks of memory, and wherein the gate array portion detects a chip select signal identifying a rank of memory corresponding to the memory access signal.

4. The system of claim 1, further comprising:
a cable connecting the DIMM and the second DIMM, wherein the cable is used to synchronize detection of memory access signals by the gate array portion and detection of memory access signals by the second gate array portion.

5. The system of claim 1, wherein the DIMM has a form factor which allows the DIMM to be housed in a 2U server.

6. A dual inline memory module (DIMM), comprising:
a dynamic random access memory (DRAM) portion;
a storage portion comprising one or more storage devices; and
a field programmable gate array (FPGA) to detect memory access signals for access to a memory address on the DRAM portion and to store information related to the memory access signals on the storage portion,
wherein the gate array portion is configured to detect memory access signals to any of one or more DIMMs coupled to the memory bus and store information related to the memory access signals directed to any of the one or more DIMMs on the storage portion;
wherein the DRAM portion includes a selected memory address, wherein an access command to the selected memory address is used to synchronize detection of memory access signals by the FPGA with detection of memory access signals by a second FPGA of a second DIMM.

7. The DIMM of claim 6, wherein the one or more storage devices comprises one or more flash memory chips.

8. The DIMM of claim 6, wherein the DRAM portion has two or more ranks of memory, and wherein the FPGA detects a chip select signal identifying a rank of memory corresponding to the memory access signal.

9. The DIMM of claim 6, wherein the DIMM has a form factor which allows the DIMM to be housed in a 2U server.

10. A method, comprising:
   detecting, by a dual inline memory module (DIMM), a memory access signal for access to a memory address on a dynamic random access memory (DRAM) portion coupled to the DIMM; and
   storing information related to the memory access signals on a storage portion comprising one or more storage devices on the DIMM,
   wherein detecting comprises detecting memory access signals to any of one or more DIMMs coupled to a memory bus;
   wherein the DRAM portion includes a selected memory address, wherein an access command to the selected memory address is used to synchronize detection of memory access signals by the FPGA with detection of memory access signals by a second FPGA of a second DIMM.

11. The method of claim 10, wherein the one or more storage devices comprises storage portion includes one or more flash memory chips.

12. The method of claim 10, wherein detecting the memory access signal includes detecting a chip select signal identifying a rank of memory of the DRAM portion corresponding to the memory access signal.

* * * * *